US 9,509,264 B2

(12) United States Patent
Imayama

(10) Patent No.: US 9,509,264 B2
(45) Date of Patent: Nov. 29, 2016

(54) DIFFERENTIAL AMPLIFYING CIRCUIT AND MICROPHONE/AMPLIFIER SYSTEM

(71) Applicant: Kabushiki Kaisha Toshiba, Minato-ku, Tokyo (JP)

(72) Inventor: Teruo Imayama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 14/479,779

(22) Filed: Sep. 8, 2014

(65) Prior Publication Data
US 2015/0171806 A1   Jun. 18, 2015

(30) Foreign Application Priority Data
Dec. 13, 2013   (JP) ................. 2013-258480

(51) Int. Cl.
*H03F 3/45* (2006.01)
*H03F 3/187* (2006.01)

(52) U.S. Cl.
CPC .......... *H03F 3/45475* (2013.01); *H03F 3/187* (2013.01); *H03F 3/45* (2013.01); *H03F 2003/4504* (2013.01); *H03F 2200/03* (2013.01); *H03F 2203/45244* (2013.01); *H03F 2203/45528* (2013.01); *H03F 2203/45542* (2013.01); *H03F 2203/45544* (2013.01); *H03F 2203/45548* (2013.01); *H03F 2203/45576* (2013.01); *H03F 2203/45591* (2013.01)

(58) Field of Classification Search
CPC ............. H03F 2200/451; H03F 3/211; H03F 3/45475; H03F 3/195; H03F 3/68; H03F 3/72; H03F 2200/129; H03F 2200/261; H03F 2200/387; H03F 1/0277; H03F 1/56; H03F 2200/294; H03F 2200/411; H03F 2203/2112; H03F 3/45; H03F 1/34; H03F 2003/4504; H03F 2003/45049; H03F 2203/30063; H03F 2203/45244; H03G 1/0088; H03G 1/0035
USPC ................... 330/69, 254, 260, 261
See application file for complete search history.

(56) References Cited

U.S. PATENT DOCUMENTS

| | | | | |
|---|---|---|---|---|
| 7,102,441 B2* | 9/2006 | Lee | ....... | H03G 1/0088 330/254 |
| 7,352,238 B2* | 4/2008 | Elwan | ....... | H03G 1/0088 330/144 |
| 7,821,341 B2* | 10/2010 | Kim | ....... | H03F 3/45475 330/254 |
| 7,956,680 B2* | 6/2011 | Lo | ....... | H04B 1/30 330/282 |
| 8,674,743 B1* | 3/2014 | Tang | ....... | H03F 3/45201 327/306 |
| 2005/0046475 A1* | 3/2005 | Sobel | ....... | H03F 3/087 330/69 |

(Continued)

FOREIGN PATENT DOCUMENTS

| JP | 2008-148147 A | 6/2008 |
|---|---|---|
| JP | 2010-166553 A | 7/2010 |

(Continued)

*Primary Examiner* — Khanh V Nguyen
(74) *Attorney, Agent, or Firm* — White & Case LLP

(57) ABSTRACT

The differential amplifying circuit includes a first bias resistor having a variable resistance and connected between the first input terminal and the reference voltage node. The differential amplifying circuit includes a second bias resistor having a variable resistance and connected between the second input terminal and the reference voltage node. The differential amplifying circuit includes a controlling circuit that controls the resistance of the first bias resistor and the resistance of the second bias resistor in synchronization with each other.

20 Claims, 4 Drawing Sheets

(56) References Cited

U.S. PATENT DOCUMENTS

2009/0002075 A1 1/2009 Chilakapati et al.
2012/0019290 A1 1/2012 Ogawa

FOREIGN PATENT DOCUMENTS

| JP | 2010-532640 A | 10/2010 |
| JP | 2011-055473 A | 3/2011 |

* cited by examiner

DIFFERENTIAL AMPLIFYING CIRCUIT AND MICROPHONE/AMPLIFIER SYSTEM

CROSS-REFERENCE TO RELATED APPLICATION

This application is based upon and claims the benefit of priority from the prior Japanese Patent Application No. 2013-258480, filed on Dec. 13, 2013, the entire contents of which are incorporated herein by reference.

BACKGROUND

1. Field

Embodiments described herein relate generally to a differential amplifying circuit and a microphone/amplifier system.

2. Background Art

Microphone/amplifier systems are used in audio equipment. Such a conventional microphone/amplifier system includes a microphone, a differential amplifying circuit and an A/D converter, for example.

A coupling capacitor is connected between the microphone and the differential amplifying circuit. The coupling capacitor usually has a capacitance of several µF to several tens of µF in order to pass an audio band of 20 Hz to 20 kHz. The differential amplifying circuit has a gain of about 40 dB in a tablet application, for example. The input impedance (≈input resistance) is as high as about 20 kΩ.

With the conventional microphone/amplifier system, in order for the differential amplifying circuit to stably operate, the differential amplifying circuit has to operate with the input terminals thereof kept stable at a predetermined potential (=operating point). If the potential at the input terminals deviates from the predetermined potential, the differential amplifying circuit has to quickly recover from the state.

DETAILED DESCRIPTION

A differential amplifying circuit according to an embodiment amplifies signals input to a first input terminal and a second input terminal and outputs amplified signals. The differential amplifying circuit includes a first input resistor connected to the first input terminal at a first end thereof. The differential amplifying circuit includes a second input resistor connected to the second input terminal at a first end thereof. The differential amplifying circuit includes an operational amplifier that is connected to a second end of the first input resistor at a non-inverting input terminal thereof and to a second end of the second input resistor at an inverting input terminal thereof and outputs a first differential signal at an inverting output terminal thereof and a second differential signal at a non-inverting output terminal thereof. The differential amplifying circuit includes a first feedback resistor connected between the inverting output terminal and the non-inverting input terminal of the operational amplifier. The differential amplifying circuit includes a second feedback resistor connected between the non-inverting output terminal and the inverting input terminal of the operational amplifier. The differential amplifying circuit includes a first bias resistor having a variable resistance and connected between the first input terminal and a reference voltage node. The differential amplifying circuit includes a second bias resistor having a variable resistance and connected between the second input terminal and the reference voltage node.

In the following, an embodiment will be described with reference to the drawings.

First Embodiment

Figure 1:
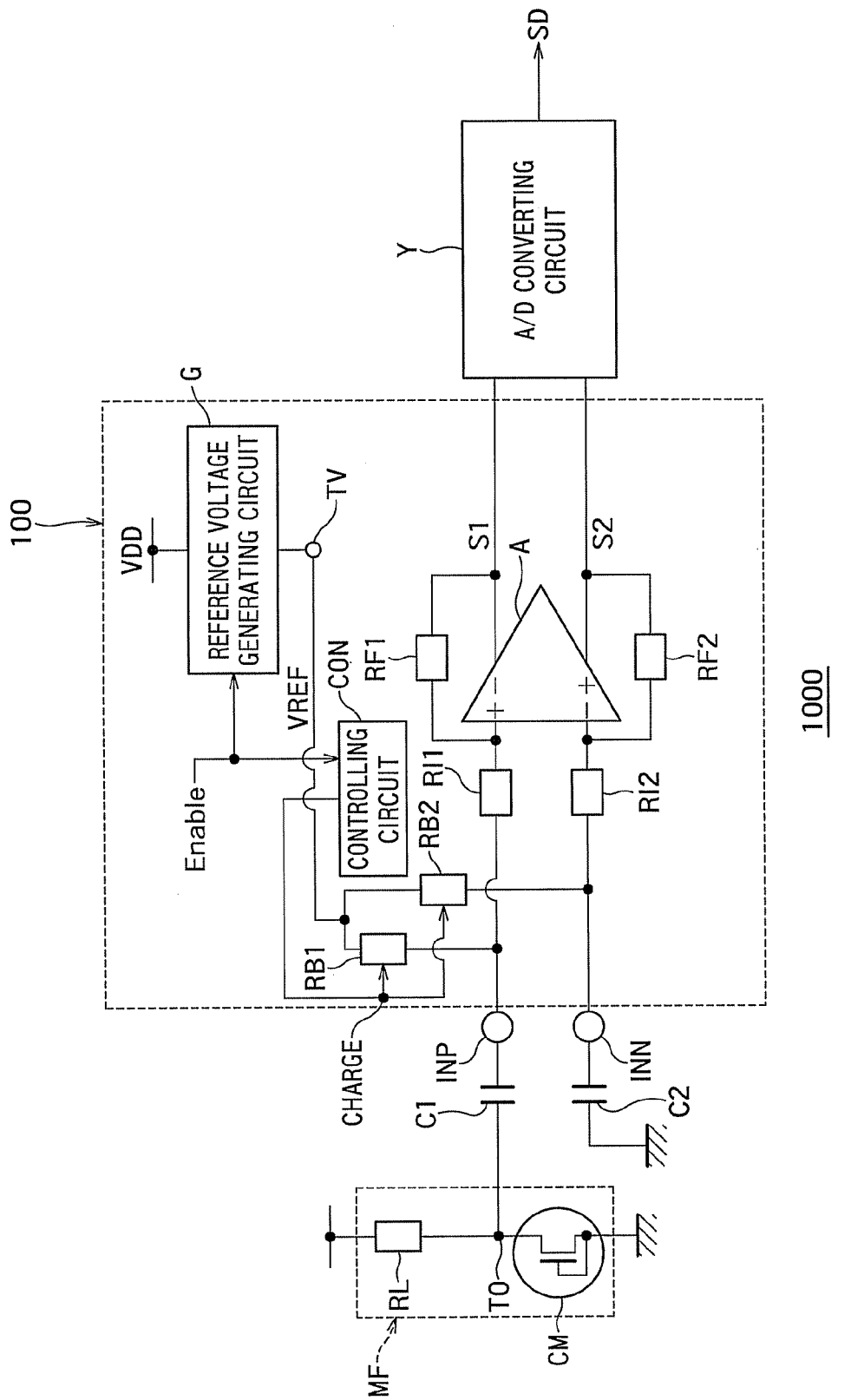
FIG. 1 is a diagram showing an example of a configuration of a microphone/amplifier system 1000 including a differential amplifying circuit 100 according to a first embodiment.
Figure 2:
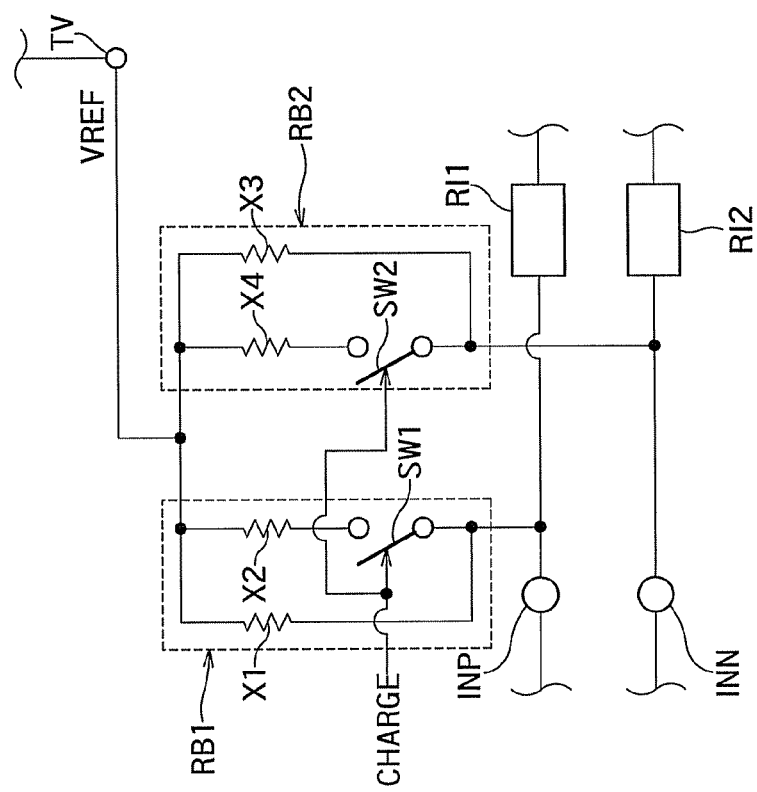
FIG. 2 is a diagram showing an example of a specific circuit configuration of a first bias resistor "RB1" and a second bias resistor "RB2" shown in FIG. 1.

FIG. 1 is a diagram showing an example of a configuration of a microphone/amplifier system 1000 including a differential amplifying circuit 100 according to a first embodiment. FIG. 2 is a diagram showing an example of a specific circuit configuration of a first bias resistor "RB1" and a second bias resistor "RB2" shown in FIG. 1.

As shown in FIG. 1, the microphone/amplifier system 1000 used in audio equipment includes a microphone "MF", a first capacitor "C1", a second capacitor "C2", the differential amplifying circuit 100 and an A/D converter "Y", for example.

The microphone "MF" has a condenser microphone "CM" and a load resistor "RL" connected in series between a power supply and a ground. The microphone "MF" outputs an analog signal at an output "TO" between the condenser microphone "CM" and the load resistor "RL".

The first capacitor "C1" is connected between the output "TO" of the microphone "MF" and a first input terminal "INP" of the differential amplifying circuit 100.

The second capacitor "C2" is connected between the ground and a second input terminal "INN" of the differential amplifying circuit 100.

The differential amplifying circuit 100 operates on electric power supplied from the power supply. The differential amplifying circuit 100 amplifies signals input to the first input terminal "INP" and the second input terminal "INN" and outputs the amplified signals.

As shown in FIG. 1, the differential amplifying circuit 100 includes a first input resistor "RI1", a second input resistor "RI2", an operational amplifier "A", a first feedback resistor "RF1", a second feedback resistor "RF2", a reference voltage generating circuit "G", a first bias resistor "RB1", a second bias resistor "RB2" and a controlling circuit "CON", for example.

The first input resistor "RI1" is connected to the first input terminal "INP" at one end thereof.

The second input resistor "RI2" is connected to the second input terminal "INN" at one end thereof.

The operational amplifier "A" is connected to another end of the first input resistor "RI1" at a non-inverting input terminal thereof and to another end of the second input resistor "RI2" at an inverting input terminal thereof. The operational amplifier "A" outputs a first differential signal "S1" at an inverting output terminal thereof and a second differential signal "S2" at a non-inverting output terminal thereof.

The first feedback resistor "RF1" is connected between the inverting output terminal and the non-inverting input terminal of the operational amplifier "A".

The second feedback resistor "RF2" is connected between the non-inverting output terminal and the inverting input terminal of the operational amplifier "A".

The reference voltage generating circuit "G" generates a reference voltage "VREF" from a power supply voltage "VDD" supplied from the power supply and outputs the reference voltage "VREF" to a reference voltage node "TV". The reference voltage generating circuit "G" starts operating in response to an enable signal "Enable", and increases the voltage at the reference voltage node "TV" from a ground potential to a predetermined target value. In this way, a predetermined reference voltage "VREF" is output at the reference voltage node "TV".

Note that the reference voltage "VREF" is also used as a voltage for determining an operating point of the operational amplifier "A".

The first bias resistor "RB1" is connected between the first input terminal "INP" of the differential amplifying circuit 100 and the reference voltage node "TV". The first input terminal "INP" is charged by the reference voltage generating circuit "G" via the first bias resistor "RB1".

The first bias resistor "RB1" has a variable resistance. The rate of charging of the first input terminal "INP" is adjusted by adjusting the resistance of the first bias resistor "RB1".

As shown in FIG. 2, the first bias resistor "RB1" has a first resistive element "X1", a second resistive element "X2" and a first switch element "SW1", for example.

The first resistive element "X1" is connected between the first input terminal "INP" and the reference voltage node "TV".

The second resistive element "X2" is connected between the first input terminal "INP" and the reference voltage node "TV".

The first switch element "SW1" is connected in series with the second resistive element "X2" between the first input terminal "INP" and the reference voltage node "TV". The first switch element "SW1" is turned on and off under the control of the controlling circuit "CON".

The first resistive element "X1" is connected in parallel with the second resistive element "X2" and the first switch element "SW1" between the first input terminal "INP" and the reference voltage node "TV".

For example, if the first switch element "SW1" is turned on by a controlling signal "CHARGE", the resistance of the first bias resistor "RB1" is set at a first value (a combined resistance of the first resistive element "X1" and the second resistive element "X2").

On the other hand, if the first switch element "SW1" is turned off by the controlling signal "CHARGE", the resistance of the first bias resistor "RB1" is set at a third value (a resistance of the first resistive element "X1").

As shown in FIG. 1, the second bias resistor "RB2" is connected between the second input terminal "INN" of the differential amplifying circuit 100 and the reference voltage node "TV". The second input terminal "INN" is charged by the reference voltage generating circuit "G" via the second bias resistor "RB2".

The second bias resistor "RB2" has a variable resistance. The rate of charging of the second input terminal "INN" is adjusted by adjusting the resistance of the second bias resistor "RB2".

As shown in FIG. 2, the second bias resistor "RB2" has a third resistive element "X3", a second switch element "SW2" and a fourth resistive element "X4", for example.

The third resistive element "X3" is connected between the second input terminal "INN" and the reference voltage node "TV".

The fourth resistive element "X4" is connected between the second input terminal "INN" and the reference voltage node "TV".

The second switch element "SW2" is connected in series with the fourth resistive element "X4" between the second input terminal "INN" and the reference voltage node "TV". The second switch element "SW2" is turned on and off under the control of the controlling circuit "CON".

The third resistive element "X3" is connected in parallel with the fourth resistive element "X4" and the second switch element "SW2" between the second input terminal "INN" and the reference voltage node "TV".

For example, if the second switch element "SW2" is turned on by the controlling signal "CHARGE", the resistance of the second bias resistor "RB2" is set at a second value (a combined resistance of the third resistive element "X3" and the fourth resistive element "X4").

On the other hand, if the second switch element "SW2" is turned off by the controlling signal "CHARGE", the resistance of the second bias resistor "RB2" is set at a fourth value (a resistance of the third resistive element "X3").

The resistance (at least the third value) of the first bias resistor "RB1" and the resistance (at least the fourth value) of the second bias resistor "RB2" are controlled to be greater than the resistances of the first input resistor "RI1" and the second input resistor "RI2".

This can reduce an influence on analog signals (attenuation of analog signals) input to the first input terminal "INP" and the second input terminal "INN".

In addition, the resistance (at least the third value) of the first bias resistor "RB1" and the resistance (at least the fourth value) of the second bias resistor "RB2" are controlled to be smaller than the resistances of the first feedback resistor "RF1" and the second feedback resistor "RF2".

This can make the time required for the voltages at the first input terminal "INP" and the second input terminal "INN" to converge to a predetermined value shorter than conventional.

In addition, the resistance (at least the third value) of the first bias resistor "RB1" and the resistance (at least the fourth value) of the second bias resistor "RB2" are controlled to be greater than the resistance of the load resistor "RL".

This can reduce the influence of the output of the microphone "MF" on analog signals (attenuation of analog signals).

As shown in FIG. 1, the A/D converting circuit "Y" performs analog-to-digital conversion of the first differential signal "S1" and the second differential signal "S2" and outputs a resulting digital signal "SD". The digital signal "SD" is digitally processed as an audio signal by a processing part (not shown).

The controlling circuit "CON" generates the controlling signal "CHARGE" and controls the resistance of the first bias resistor "RB1" and the resistance of the second bias resistor "RB2" in synchronization with each other. More preferably, the controlling circuit "CON" performs the control so as to make the resistance of the first bias resistor "RB1" and the resistance of the second bias resistor "RB2" equal to each other.

For example, upon power-on, the controlling circuit "CON" sets the resistance of the first bias resistor "RB1" at the first value and the resistance of the second bias resistor "RB2" at the second value.

More specifically, for example, as shown in FIG. 2, the controlling circuit "CON" turns on the first switch element "SW1" and the second switch element "SW2" with the controlling signal "CHARGE". As a result, the resistance of the first bias resistor "RB1" is set at the first value, and the resistance of the second bias resistor "RB2" is set at the second value.

The controlling circuit "CON" then sets the resistance of the first bias resistor "RB1" at the third value greater than the first value and the resistance of the second bias resistor "RB2" at the fourth value greater than the second value.

More specifically, for example, as shown in FIG. 2, the controlling circuit "CON" turns off the first switch element "SW1" and the second switch element "SW2" with the controlling signal "CHARGE". As a result, the resistance of the first bias resistor "RB1" is set at the third value (the resistance of the first resistive element "X1"), and the resistance of the second bias resistor "RB2" is set at the fourth value (the resistance of the third resistive element "X3").

As described above, upon power-on, the controlling circuit "CON" performs control to set the resistances of the first bias resistor "RB1" and the second bias resistor "RB2" at lower values. This allows reduction of the time (time constant) required for transition of the potentials at the first input terminal "INP" and the second input terminal "INN" to a predetermined potential and the time required for stabilization of the operating point of the operational amplifier "A".

After that (after the operation of the operational amplifier "A" is stabilized), the controlling circuit "CON" perform control to increase the resistances of the first bias resistor "RB1" and the second bias resistor "RB2" to a value within a range that does not have an influence on the performance of the differential amplifying circuit. This allows the time (time constant) required for transition of the potentials at the first and second input terminals to a predetermined potential to be kept relatively short and allows reduction of the time required for recovery from disturbing noise. If the first bias resistor "RB1" and the second bias resistor "RB2" according to this application are not provided, the time constant is longer, so that it takes a longer time to recover from disturbing noise.

The controlling circuit "CON" is configured to acquire information or the like about the power-on or the operation of the reference voltage generating circuit "G" from the enable signal "Enable".

For example, the enable signal "Enable" indicates that the power supply voltage "VDD" has reached a predetermined value after power-on. The reference voltage generating circuit "G" starts operating and generates the reference voltage "VREF" in response to the enable signal "Enable". In this case, the controlling circuit "CON" can respond to the enable signal "Enable" by controlling the resistances of the first bias resistor "RB1" and the second bias resistor "RB2" at the time when the reference voltage generating circuit "G" starts operating.

Alternatively, the controlling circuit "CON" may set the resistance of the first bias resistor "RB1" at the third value and the resistance of the second bias resistor "RB2" at the fourth value when a preset predetermined period of time has elapsed since the reference voltage generating circuit "G" started operating in response to the enable signal "Enable" after power-on.

Alternatively, the controlling circuit "CON" may set the resistance of the first bias resistor "RB1" at the third value and the resistance of the second bias resistor "RB2" at the fourth value when an average value of the first differential signal "S1" and the second differential signal "S2" has reached the operating point of the operational amplifier "A" after power-on.

Alternatively, the controlling circuit "CON" may set the resistance of the first bias resistor "RB1" at the third value and the resistance of the second bias resistor "RB2" at the fourth value when the reference voltage "VREF" has reached a preset value.

Alternatively, the controlling circuit "CON" may set the resistance of the first bias resistor "RB1" at the first value and the resistance of the second bias resistor "RB2" at the second value in response to the enable signal "Enable". After that, when a preset predetermined period of time has elapsed, the controlling circuit "CON" then sets the resistance of the first bias resistor "RB1" at the third value and the resistance of the second bias resistor "RB2" at the fourth value.

Alternatively, the controlling circuit "CON" may control the resistance of the first bias resistor "RB1" and the resistance of the second bias resistor "RB2" in synchronization with each other in response to the digital signal "SD".

For example, when the operational amplifier "A" starts operating, the A/D converting circuit "Y" starts outputting the digital signal "SD". Once the operation of the operational amplifier "A" is stabilized, the digital signal "SD" indicates a predetermined value.

In view of this, the controlling circuit "CON" may set the resistance of the first bias resistor "RB1" at the first value and the resistance of the second bias resistor "RB2" at the second value when the A/D converting circuit "Y" starts outputting the digital signal "SD". After that, once the digital signal "SD" indicates a predetermined value, the controlling circuit "CON" can set the resistance of the first bias resistor "RB1" at the third value and the resistance of the second bias resistor "RB2" at the fourth value.

Figure 3:
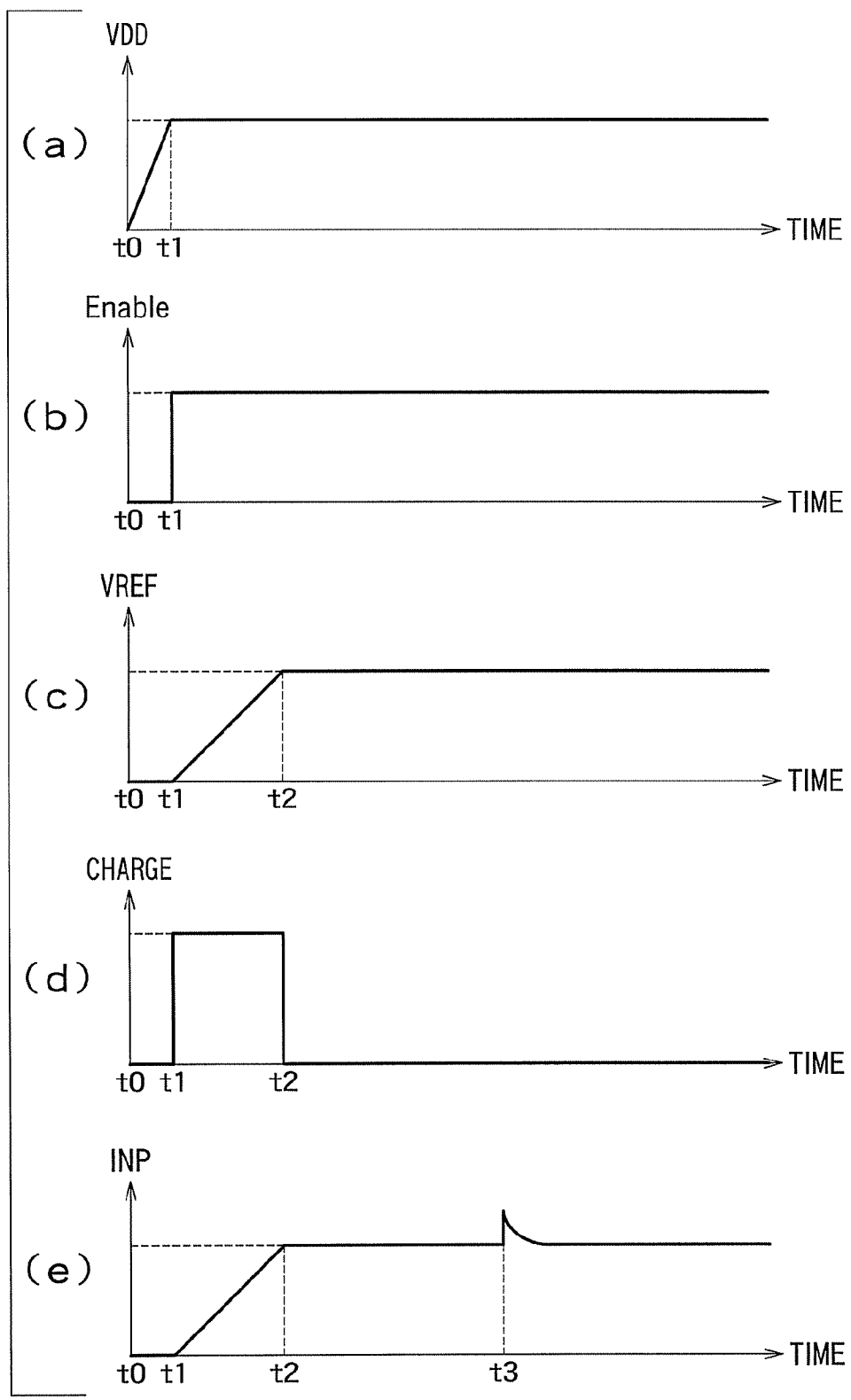
FIG. 3(a) is a waveform diagram showing an example of a waveform of the power supply voltage "VDD"
FIG. 3(b) is a waveform diagram showing an example of a waveform of the enable signal "Enable"
FIG. 3(c) is a waveform diagram showing an example of a waveform of the reference voltage "VREF"
FIG. 3(d) is a waveform diagram showing an example of a waveform of the controlling signal "CHARGE"
FIG. 3(e) is a waveform diagram showing an example of a waveform of the first input signal at the first input terminal "INP"

Next, an example of operational characteristics of the differential amplifying circuit 100 according to this embodiment configured as described above will be described. FIG. 3(a) is a waveform diagram showing an example of a waveform of the power supply voltage "VDD". FIG. 3(b) is a waveform diagram showing an example of a waveform of the enable signal "Enable". FIG. 3(c) is a waveform diagram showing an example of a waveform of the reference voltage "VREF". FIG. 3(d) is a waveform diagram showing an example of a waveform of the controlling signal "CHARGE". FIG. 3(e) is a waveform diagram showing an example of a waveform of the first input signal at the first input terminal "INP". FIG. 3(e) shows a state where the microphone "MF" outputs no signal.

For example, as shown in FIG. 3(a), the power supply is turned on at a time "t0", and the power supply voltage "VDD" starts increasing.

At the time "t0", the enable signal "Enable" is at a "Low" level (see FIG. 3(b)), and the reference voltage generating circuit "G" is not in operation. Therefore, the reference voltage "VREF" is the ground voltage (see FIG. 3(c)).

At the time "t0", the controlling circuit "CON" sets the controlling signal "CHARGE" at the "Low" level (see FIG.

3(d)). As a result, the resistance of the first bias resistor "RB1" is set at the third value, and the resistance of the second bias resistor "RB2" is set at the fourth value.

At the time "t0", since there is no signal input from the microphone "MF", the first input signal at the first input terminal "INP" is at the ground voltage level (see FIG. 3(e)).

At a subsequent time "t1", the power supply voltage "VDD" reaches to a predetermined value.

At the time "t1", the enable signal "Enable" is set at a "High" level (see FIG. 3(b)), and the reference voltage generating circuit "G" starts operating. As a result, the reference voltage "VREF" starts increasing (see FIG. 3(c)).

At the time "t1", since the enable signal "Enable" is at the "High" level, the controlling circuit "CON" sets the controlling signal "CHARGE" at the "High" level (see FIG. 3(d)). As a result, the resistance of the first bias resistor "RB1" is set at the first value smaller than the third value, and the resistance of the second bias resistor "RB2" is set at the second value smaller than the fourth value.

In addition, at the time "t1", the first input terminal "INP" is charged by the reference voltage generating circuit "G" via the first bias resistor "RB1", and the level of the first input signal at the first input terminal "INP" increases as the reference voltage "VREF" increases (see FIG. 3(e)).

At a subsequent time "t2", the reference voltage "VREF" reaches a preset value (see FIG. 3(c)).

At the time "t2", since a preset predetermined period of time has elapsed since the time "t1", the controlling circuit "CON" sets the controlling signal "CHARGE" at the "Low" level (see FIG. 3(d)). As a result, the resistance of the first bias resistor "RB1" is set at the third value, and the resistance of the second bias resistor "RB2" is set at the fourth value.

In addition, the first input terminal "INP" is charged by the reference voltage generating circuit "G" via the first bias resistor "RB1", and the first input signal at the first input terminal "INP" reaches a predetermined value (see FIG. 3(e)).

As described above, the controlling circuit "CON" sets the controlling signal "CHARGE" at the "Low" level when a preset predetermined period of time (from the time "t1" to the time "t2") has elapsed since the reference voltage generating circuit "G" started operating (at the time "t1") in response to the enable signal "Enable" after power-on (at the time "t0").

As a result, the resistance of the first bias resistor "RB1" is set at the third value, and the resistance of the second bias resistor "RB2" is set at the fourth value.

As described above, the resistance of the first bias resistor "RB1" and the resistance of the second bias resistor "RB2" are set at the first and second values, respectively, in the period from the power-on until the operating point of the operational amplifier "A" is stabilized, and are switched to the third and fourth values, respectively, once the operating point of the operational amplifier "A" is stabilized.

As described later, this allows reduction of the time (time constant) required for transition of the potential at the input terminals of the differential amplifying circuit to a predetermined potential, reduction of the time from the power-on until the operating point is stabilized, and reduction of the time required for recovery from a state where deviation from the operating point is caused by disturbing noise after the operating point is once stabilized.

Next, as an example, consider a case where both the first capacitance "C1" and the second capacitance "C2" are 1 μF, the load resistance "RL" is 2.2 kΩ, both the first input resistance "RI1" and the second input resistance "RI2" are 20 kΩ, and both the first feedback resistance "RF1" and the second feedback resistance "RF2" are 2 MΩ. In this case, in order to avoid having an influence on the performance after the operating point is stabilized, the bias resistances "RB1" and "RB2" are set at about 100 kΩ, which is sufficiently greater than the load resistance "RL", which is equal to 2.2 kΩ.

The bias resistances "RB1" and "RB2" at the time of power-on are set at 1 kΩ, which does not have an influence on the reference voltage generating circuit "G".

In this case, a time constant "t" at the time of power-on is expressed by the following formula (1).

$$t \approx C1 \times (RB1/(1+(RB1/(RI1+RF1))))$$

Since RB1 equals to 1 kΩ, which is sufficiently smaller than the value of RI1+RF1 (which equals to 2.02 MΩ), the following equation holds.

$$RB1/(RI1+RF1) \approx 0$$

Therefore, the following formula holds.

$$t \approx C1 \times RB1 = 1 \text{ uF} \times 1 \text{ k}\Omega = 1 \text{ ms} \quad (1)$$

The time constant "t" after the operating point is stabilized can be expressed by the following formula (2).

$$t \approx C1 \times (RB1/(1+(RB1/(RI1+RF1))))$$

Since RB1 equals to 100 kΩ, which is sufficiently smaller than the value of RI1+RF1 (which equals to 2.02 MΩ), the following equation holds.

$$RB1/(RI1+RF1) \approx 0$$

Therefore, the following formula holds.

$$t \approx C1 \times RB1 = 1 \text{ uF} \times 100 \text{ k}\Omega = 0.1 \text{ s} \quad (2)$$

As can be seen from the formula (2), the time constant "t" after the operating point is stabilized is about 0.1 s, which is extremely short. Even compared with the comparative example described below, recovery from the state where deviation from the operating point is caused by disturbing noise is dramatically quick.

Figure 4:
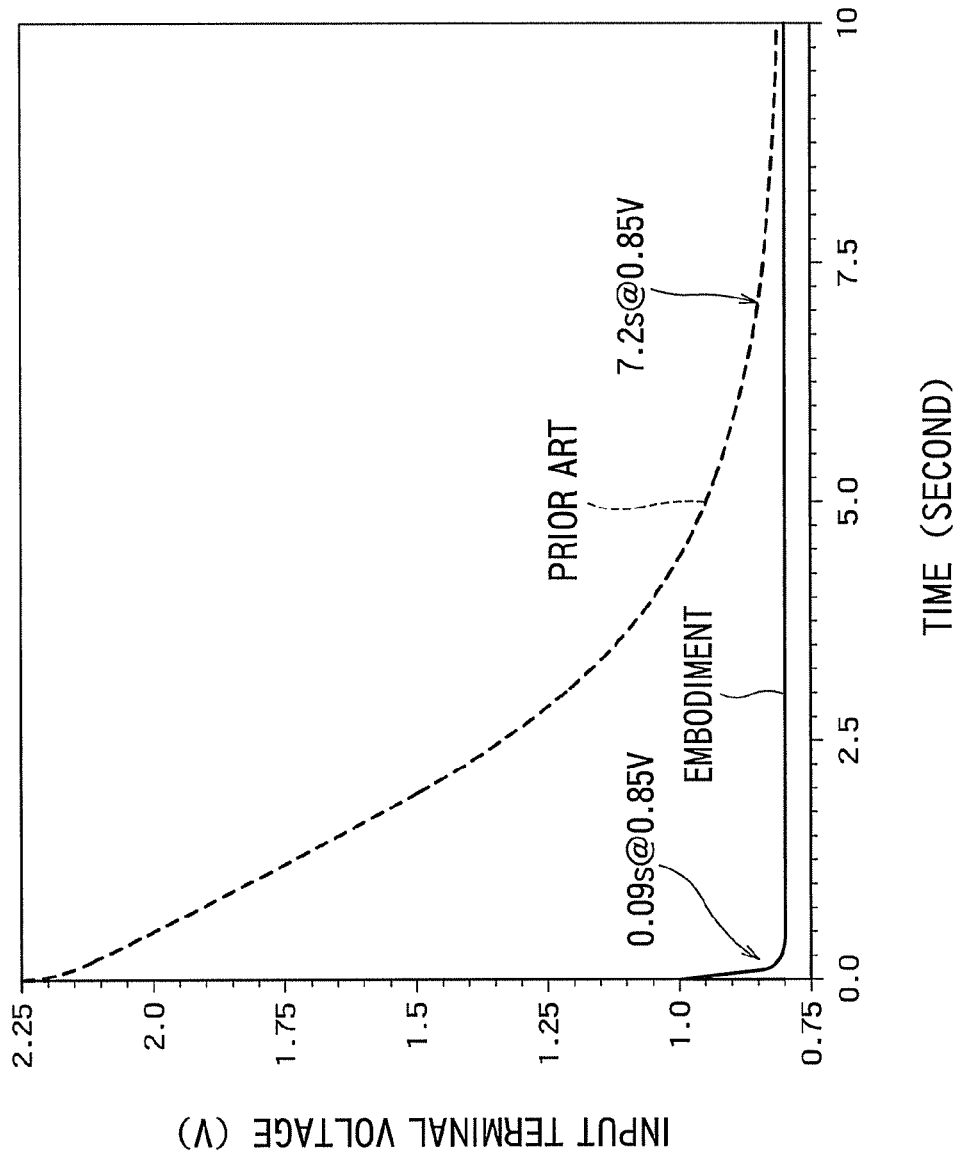
FIG. 4 is a characteristic diagram showing examples of characteristics of the potential at an input terminal of the differential amplifying circuit with respect to time according to the first embodiment and a comparative example in a case where disturbing noise occurs.

FIG. 4 is a characteristic diagram showing examples of characteristics of the potential at an input terminal of the differential amplifying circuit with respect to time according to the first embodiment and a comparative example in a case where disturbing noise occurs. In FIG. 4, the vertical axis indicates the potential at the first input terminal "INP" of the differential amplifying circuit 100, and the horizontal axis indicates time. The comparative example shows characteristics of a differential amplifying circuit that does not include the first and second bias resistors.

Disturbing noise is injected immediately (0 ms) after the operating point is stabilized (this point in time corresponds to the time "t3" in the embodiment shown in FIG. 3(e)). As will be apparent from FIG. 4, according to this embodiment, recovery from the state where deviation from the operating point is caused by disturbing noise is dramatically quick.

As described above, according to this embodiment, the time required for stabilization of the operating point can be reduced, and the time required for recovery from the state where deviation from the operating point is caused by disturbing noise after the operating point is once stabilized can also be reduced. In addition, this embodiment can be implemented with an extremely simple circuit configuration.

As described above, with the differential amplifying circuit according to this embodiment, the time required for stabilization of the circuit operation after power-on can be reduced, and the time required for recovery from an influence of disturbing noise after the circuit operation is once stabilized can also be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A differential amplifying circuit that amplifies signals input to a first input terminal and a second input terminal and outputs amplified signals, the differential amplifying circuit comprises:
   a first input resistor connected to the first input terminal at a first end thereof;
   a second input resistor connected to the second input terminal at a first end thereof;
   an operational amplifier that is connected to a second end of the first input resistor at a non-inverting input terminal thereof and to a second end of the second input resistor at an inverting input terminal thereof and outputs a first differential signal at an inverting output terminal thereof and a second differential signal at a non-inverting output terminal thereof;
   a first feedback resistor connected between the inverting output terminal and the non-inverting input terminal of the operational amplifier;
   a second feedback resistor connected between the non-inverting output terminal and the inverting input terminal of the operational amplifier;
   a first bias resistor having a variable resistance and connected between the first end of the first input resistor and a reference voltage node; and
   a second bias resistor having a variable resistance and connected between the first end of the second input resistor and the reference voltage node.

2. The differential amplifying circuit according to claim 1, further comprising a controlling circuit that controls the resistance of the first bias resistor and the resistance of the second bias resistor in synchronization with each other.

3. The differential amplifying circuit according to claim 1, further comprising a reference voltage generating circuit that generates a reference voltage and outputs the reference voltage to the reference voltage node.

4. The differential amplifying circuit according to claim 3, further comprising a controlling circuit that controls the resistance of the first bias resistor and the resistance of the second bias resistor in synchronization with each other.

5. The differential amplifying circuit according to claim 2, wherein the controlling circuit
   sets the resistance of the first bias resistor at a first value and the resistance of the second bias resistor at a second value at a time of power-on, and
   then sets the resistance of the first bias resistor at a third value greater than the first value and the resistance of the second bias resistor at a fourth value greater than the second value.

6. The differential amplifying circuit according to claim 5, wherein the controlling circuit
   sets the resistance of the first bias resistor at the third value and the resistance of the second bias resistor at the fourth value when a preset predetermined period of time elapses after the reference voltage generating circuit starts operating.

7. The differential amplifying circuit according to claim 5, wherein the third value for the first bias resistor and the fourth value for the second bias resistor are greater than resistances of the first input resistor and the second input resistor and smaller than resistances of the first feedback resistor and the second feedback resistor.

8. The differential amplifying circuit according to claim 5, wherein the controlling circuit
   sets the resistance of the first bias resistor at the third value and the resistance of the second bias resistor at the fourth value when an average value of the first differential signal and the second differential signal reaches an operating point of the operational amplifier.

9. The differential amplifying circuit according to claim 5, wherein the controlling circuit
   sets the resistance of the first bias resistor at the third value and the resistance of the second bias resistor at the fourth value when the reference voltage reaches a preset value.

10. The differential amplifying circuit according to claim 5, wherein the reference voltage generating circuit starts operating and generates the reference voltage in response to an enable signal, and
    the controlling circuit
    sets the resistance of the first bias resistor at the first value and the resistance of the second bias resistor at the second value in response to the enable signal, and
    then sets the resistance of the first bias resistor at the third value and the resistance of the second bias resistor at the fourth value when a preset predetermined time elapses.

11. A microphone/amplifier system, comprising:
    a microphone that has a condenser microphone and a load resistor connected in series with each other between a power supply and a ground and outputs an analog signal between the condenser microphone and the load resistor;
    a first capacitor connected between an output of the microphone and a first input terminal;
    a second capacitor connected between the ground and a second input terminal; and
    a differential amplifying circuit that amplifies signals input to the first input terminal and the second input terminal and outputs the amplified signals,
    wherein the differential amplifying circuit comprises:
    a first input resistor connected to the first input terminal at a first end thereof;
    a second input resistor connected to the second input terminal at a first end thereof;
    an operational amplifier that is connected to a second end of the first input resistor at a non-inverting input terminal thereof and to a second end of the second input resistor at an inverting input terminal thereof and outputs a first differential signal at an inverting output terminal thereof and a second differential signal at a non-inverting output terminal thereof;
    a first feedback resistor connected between the inverting output terminal and the non-inverting input terminal of the operational amplifier;
    a second feedback resistor connected between the non-inverting output terminal and the inverting input terminal of the operational amplifier;

a first bias resistor having a variable resistance and connected between the non-inverting input terminal of the operational amplifier and a reference voltage node; and a second bias resistor having a variable resistance and connected between the inverting input terminal of the operational amplifier and the reference voltage node.

12. The microphone/amplifier system according to claim 11, wherein the differential amplifying circuit further comprises a controlling circuit that controls the resistance of the first bias resistor and the resistance of the second bias resistor in synchronization with each other.

13. The microphone/amplifier system according to claim 11, wherein the differential amplifying circuit further comprises a reference voltage generating circuit that generates a reference voltage and outputs the reference voltage to the reference voltage node.

14. The microphone/amplifier system according to claim 13, wherein the differential amplifying circuit further comprises a controlling circuit that controls the resistance of the first bias resistor and the resistance of the second bias resistor in synchronization with each other.

15. The microphone/amplifier system according to claim 12, wherein the controlling circuit sets the resistance of the first bias resistor at a first value and the resistance of the second bias resistor at a second value at a time of power-on, and then sets the resistance of the first bias resistor at a third value greater than the first value and the resistance of the second bias resistor at a fourth value greater than the second value.

16. The microphone/amplifier system according to claim 15, wherein the third value for the first bias resistor and the fourth value for the second bias resistor are greater than a resistance of the load resistor.

17. The microphone/amplifier system according to claim 15, wherein the controlling circuit sets the resistance of the first bias resistor at the third value and the resistance of the second bias resistor at the fourth value when a preset predetermined period of time elapses after the reference voltage generating circuit starts operating.

18. The microphone/amplifier system according to claim 15, wherein the third value for the first bias resistor and the fourth value for the second bias resistor are greater than resistances of the first input resistor and the second input resistor and smaller than resistances of the first feedback resistor and the second feedback resistor.

19. The microphone/amplifier system according to claim 15, wherein the reference voltage generating circuit starts operating and generates the reference voltage in response to an enable signal, and the controlling circuit sets the resistance of the first bias resistor at the first value and the resistance of the second bias resistor at the second value in response to the enable signal, and then sets the resistance of the first bias resistor at the third value and the resistance of the second bias resistor at the fourth value when a preset predetermined time elapses.

20. The microphone/amplifier system according to claim 15, further comprising:

an A/D converting circuit that outputs a digital signal obtained by performing analog-to-digital conversion of the first differential signal and the second differential signal, wherein the controlling circuit sets the resistance of the first bias resistor at the first value and the resistance of the second bias resistor at the second value when output of the digital signal starts, and then sets the resistance of the first bias resistor at the third value and the resistance of the second bias resistor at the fourth value when the digital signal indicates a predetermined value.

\* \* \* \* \*